United States Patent [19]

Ito

[11] Patent Number: 5,653,803

[45] Date of Patent: Aug. 5, 1997

[54] METHOD OF MANUFACTURING A SUBSTRATE FOR MANUFACTURING SILICON SEMICONDUCTOR ELEMENTS

[75] Inventor: Tatsuo Ito, Joetsu, Japan

[73] Assignee: Shin-Etsu Handotai Co. Ltd., Tokyo, Japan

[21] Appl. No.: 396,773

[22] Filed: Mar. 1, 1995

[30] Foreign Application Priority Data

Mar. 4, 1994 [JP] Japan ................... 6-103453

[51] Int. Cl.$^6$ .................. C30B 25/02; H01L 21/20; H01L 21/304
[52] U.S. Cl. .................. 438/404; 117/915; 117/101; 438/460; 438/977
[58] Field of Search .................. 117/915, 101; 437/226, 130

[56] References Cited

U.S. PATENT DOCUMENTS

| 4,582,559 | 4/1986 | Tanielian et al. | 117/915 |
| 5,362,682 | 11/1994 | Bates et al. | 117/915 |
| 5,362,683 | 11/1994 | Takenaka et al. | 117/915 |

FOREIGN PATENT DOCUMENTS 0348783  3/1990  European Pat. Off. .

OTHER PUBLICATIONS

Patent Abstracts of Japan, v. 18, n8, E–1486, 7 Jan 1994 & JP–A–05 251294, Sep. 93 Matsunaga.
Patent Abstracts of Japan, v. 11, n309, E–547, 8 Oct. 1987 & JP–A–62 104062, 14 May 1987.

*Primary Examiner*—Robert Kunemund
*Attorney, Agent, or Firm*—Ronald R. Snider

[57] ABSTRACT

One or a plurality of silicon growth layers are formed on both sides of a silicon base substrate wafer and the product is then divided, with the dividing plane in said silicon base substrate wafer parallel to the main surface, into two pieces to obtain two substrates used for manufacturing silicon semiconductor elements. Said dividing-in-half process is a process in which said silicon base substrate wafer portion is cut along a plane parallel to the main surface, or a process which includes said cutting process followed by a process of treating the cut-surface. Said process which cuts the silicon base substrate wafer portion is a process in which the wafers are cut one by one, or cut after a plurality of them are laminated.

5 Claims, 13 Drawing Sheets

METHOD OF MANUFACTURING A SUBSTRATE FOR MANUFACTURING SILICON SEMICONDUCTOR ELEMENTS

BACKGROUND OF THE INVENTION

1. Field of the Invention

This invention relates to a method of manufacturing a substrate used for manufacturing silicon semiconductor elements, and more precisely, to a method of manufacturing a substrate for use in manufacturing silicon semiconductor elements comprising a silicon growth layer(s) formed on a silicon base substrate wafer, which is used for manufacturing silicon semiconductor elements such as individual semiconductor elements and integrated circuit elements.

2. The Prior Art

A wafer manufactured by forming a silicon growth layer (s), by means of the vapor phase growth method, on one surface of a silicon (Si) single crystal wafer, or of a wafer prepared by forming an impurity introduction layer(s) in a silicon single crystal wafer, or of a wafer prepared by forming a semiconductor element area(s) on a silicon single crystal wafer (hereafter these are referred to as "silicon base substrate wafers") plays an important role as a substrate for manufacturing silicon semiconductor elements, and that is in very great demand.

For example, a silicon epitaxial wafer used to manufacture IGBT (Insulated Gate Bipolar Transistor) which is a power semiconductor element combining the fast switching characteristic of a power MOSFET and the high-power characteristic of a bipolar transistor is manufactured by using the process described below.

An n+ silicon epitaxial layer with a thickness of approximately 20 micrometers and an n− silicon epitaxial layer with a thickness of approximately 180 micrometers are formed, by means of the vapor phase growth method, one after another on an approximately 450 micrometer-thick p+ silicon single crystal wafer which a conventional single-side mirror-polishing is performed, to obtain a silicon epitaxial wafer which has a n−/n+/p+ structure with a total thickness of approximately 650 micrometers. Approximately 200 micrometers of the p+ silicon single crystal wafer side is then removed by means of lapping and/or etching to obtain a silicon epitaxial wafer for manufacturing IGBT which has a n−/n+/p+ structure with a total thickness of approximately 450 micrometers.

In conventional methods such as described above, a substantial portion of the silicon single crystal which is the material for the silicon base substrate wafers is wasted, resulting in higher costs.

A silicon base substrate wafer with a thickness of approximately 450 nm is usually used to ensure the base substrate strength during the manufacturing process of the epitaxial wafer or to prevent deterioration of the crystalline quality due to thermal stress. However, after the epitaxial layer is formed, the base substrate wafer is lapped and/or etched down to obtain the final silicon epitaxial wafer with a prescribed total thickness. Specifically, approximately 200 micrometers of the thickness of the silicon base substrate wafer is removed by lapping and/or etching. Therefore, that amount of silicon single crystal is wasted.

Also, in the epitaxial growth process, there is a conductive problem in that the number of the silicon base substrate wafers to be treated in one epitaxial growth process is limited by the size of the vapor phase growth apparatus, and thus mass production is limited.

BRIEF DESCRIPTION OF THE INVENTION

Therefore, the object of this invention is to provide a method of manufacturing a substrate for manufacturing silicon semiconductor elements, with a smaller amounts of silicon single crystals which are the raw material of silicon base substrate wafers (hereafter referred to as "silicon single crystal [WAFER MATERIAL]") and with lower manufacturing costs by using the efficient vapor phase growth process.

This invention provides a method of manufacturing a substrate for manufacturing silicon semiconductor elements wherein one or a plurality of silicon growth layers are formed on both sides of a silicon base substrate wafer and then the product is derided, with the dividing plane in said silicon base substrate wafer parallel to the main surface, into two pieces to obtain two substrates used for manufacturing silicon semiconductor elements.

Said dividing-in-half process is, for example, a process in which said silicon base substrate wafer portion is cut along a plane parallel to the main surface, or a process which includes said cutting process followed by a process of treating the cut surface to make the cut-surface flat and/or to adjust the total thickness. Said process which cuts the silicon base substrate wafer portion is, for example, a process in which the wafers made by forming a silicon growth layer(s) on both sides of said silicon base substrate wafers are cut one by one, or cut after a plurality of them are laminated.

Said silicon base substrate wafer is, for example, selected among a silicon single crystal wafer, a wafer which an impurity-doped layer(s) is formed in a silicon single crystal wafer and a wafer which a semiconductor element area(s) is formed on a silicon single crystal wafer.

According to this invention, two substrates for manufacturing silicon semiconductor elements can be obtained by forming a silicon growth layer(s) on both sides of a silicon base substrate wafer and then dividing the product, with the dividing plane in said silicon base substrate wafer parallel to the main surface, into two pieces.

In this case, the thickness of silicon base substrate wafer used to obtain one wafer which a silicon growth layer(s) is formed on both sides has to be thicker because of the loss caused by dividing it into two pieces, and therefore a silicon single crystal [WAFER MATERIAL] thicker than the conventional ones is required. However, one wafer, which a silicon growth layer(s) is formed on both sides, gives two of the final target products, i.e. two of substrates for manufacturing silicon semiconductor elements, and therefore the thickness of the single crystal [WAFER MATERIAL] required to obtain one silicon base substrate wafer is less than that of the single crystal [WAFER MATERIAL] required to obtain two silicon base substrate wafers in the case of the conventional processes. Because of this, according to this invention, the thickness of the single crystal [WAFER MATERIAL] required to obtain one substrate for manufacturing silicon semiconductor elements is less than what is required for the conventional processes.

Also, according to this invention, a silicon vapor phase growth layer(s) is formed on both sides of one silicon base substrate wafer, and therefore the vapor phase growth process can be very efficiently conducted. That is, if the vapor phase growth is conducted by using the same size of a vapor phase growth apparatus, the number of the silicon base substrate wafers placed in the vapor phase growth apparatus is about the same, but this invention gives two final substrates for manufacturing silicon semiconductor elements from one silicon base substrate wafer. Therefore, the resulting number of substrates for manufacturing silicon semiconductor elements can be approximately doubled compared with the conventional processes.

DETAILED DESCRIPTION

Figure 1A:
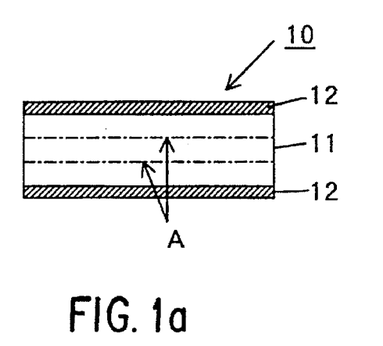
FIGS. 1a to 1d are process drawings which shows an example of the manufacturing method of this invention.
Figure 2:
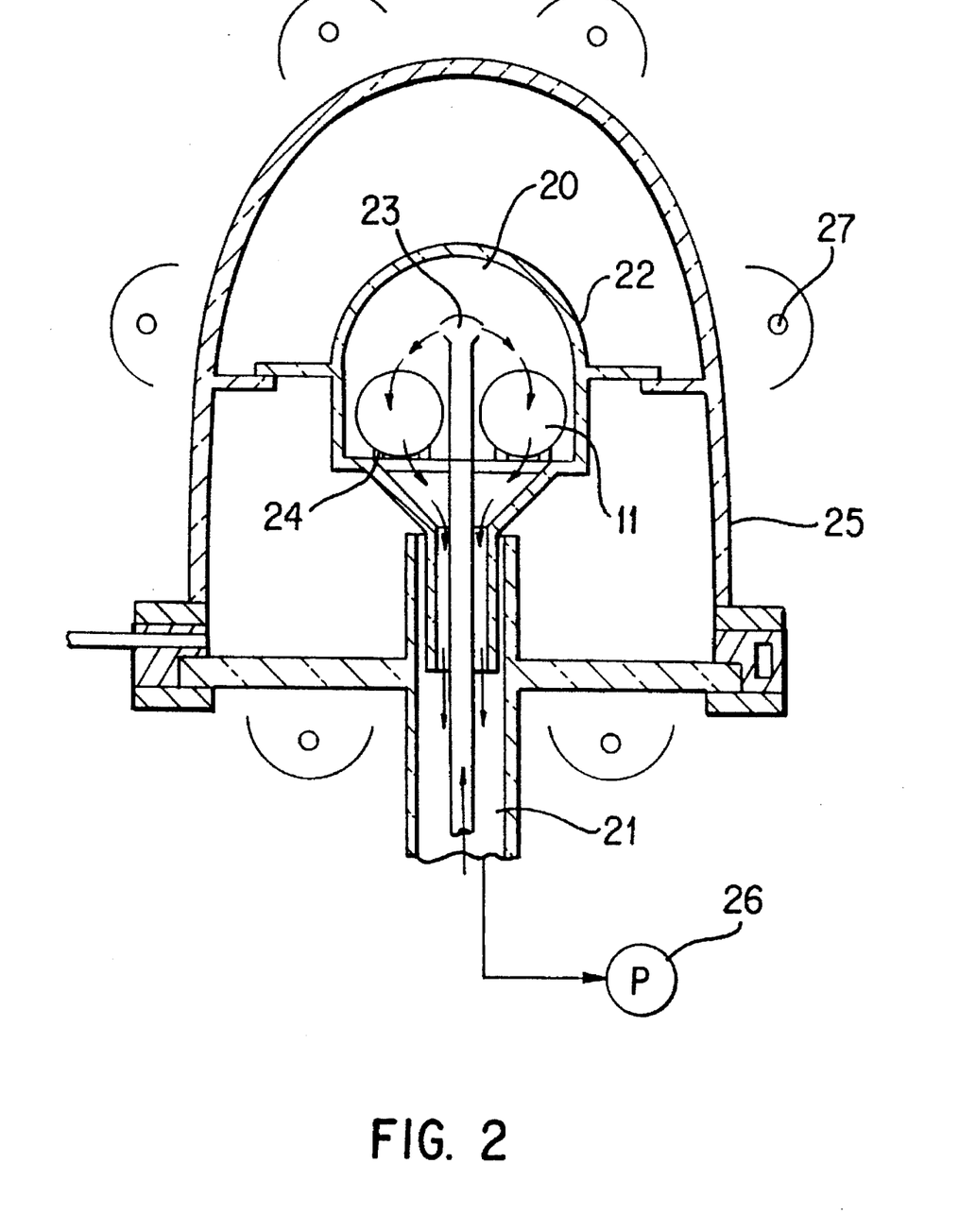
FIG. 2 is a cross section of the Hot-Wall type-reduced pressure-vapor phase growth apparatus used to form silicon growth layers on the silicon single crystal wafer in the manufacturing method of this invention.

Examples of this invention are described below by referring to drawings. FIG. 1 shows the basic process of the method of this invention. As shown in FIG. 1(a), a wafer 10 is prepared by forming a silicon growth layer 12 on both sides of a silicon base substrate wafer 11. For forming the silicon growth layer 12 on both sides of this silicon base substrate wafer 11, the Hot-Wall type-reduced pressure-vapor phase growth apparatus, whose structure is shown as an example of the vapor phase growth apparatus in FIG. 2, is used in the following procedure.

The silicon base substrate wafer 11 is placed vertically on the wafer holder 24. Then, after air in a reaction chamber 20 is replaced by the purge gas, the pressure in the reaction chamber 20 is reduced to 1–10 torr while the carrier gas ($H_2$ gas) is being fed into the reaction chamber 20.

The inner Bell Jar 22 (transparent quartz glass) is then heated via the outer Bell Jar 25 (transparent quartz glass) by the heater (infrared lights and such) placed around the exterior of the outer Bell Jar 25. When the temperature in the reaction chamber 20 is raised to and maintained at the prescribed level, the reaction gas which is mixed the carrier gas ($H_2$ gas), the silicon source gas (monosilane ($SiH_4$), trichlorosilane ($SiHCl_3$), tetrachlorosilane ($SiCl_4$), etc.) and the doping gas with prescribed ratios is fed into the reaction chamber 20 through the gas inlet tube 23.

The reaction gas thus introduced flows into the vicinity of each surface of the silicon base substrate wafer 11, and a silicon growth layer with the prescribed impurity concentration is formed on each surface of the silicon base substrate wafer 11. The unreacted gas and the byproduct gas are discharged from the exhaust port 21 via the suction pump 26.

The wafer 10 thus prepared by forming a silicon growth layer 12 on both sides of a silicon base substrate wafer 11 (FIG. 1(a)) is then cut parallel to the main surface approximately at, for example, the middle of the thickness of the silicon base substrate wafer 11 portion (cutting-position A—A) with a diamond cutter and such.

The cutting of the wafer 10 in the silicon base substrate wafer 11 portion can be done by cutting the wafer 10 one by one as described above. It is also possible to paste a plurality of the wafers 10 with a binder 13 such as wax, bees wax, synthetic resin, etc. to make a wafer lamination 14 and then to cut each of the silicon base substrate wafer 11 portions with a diamond cutter and such, as shown in FIG. 1(a)'. In this case, the cutter or the wafer lamination 14 is moved as wafers 10 are cut one after another. It is also possible to use multiple cutters such as a wire saw and multi-blade to cut a plurality of the wafers 10 simultaneously.

Figure 1B:
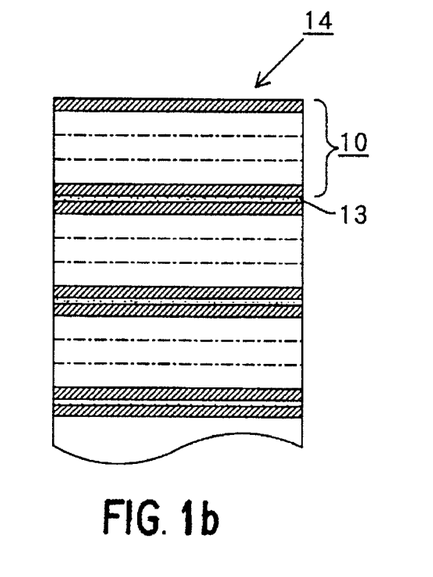
Figure 1C:
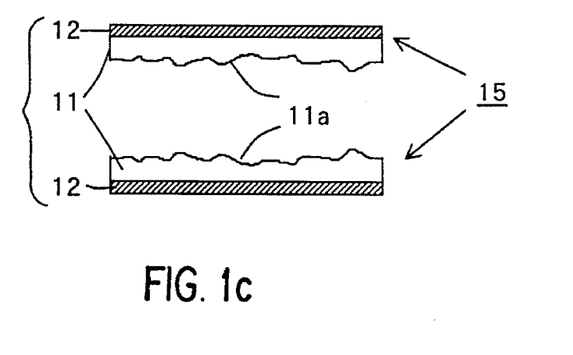
Figure 1D:
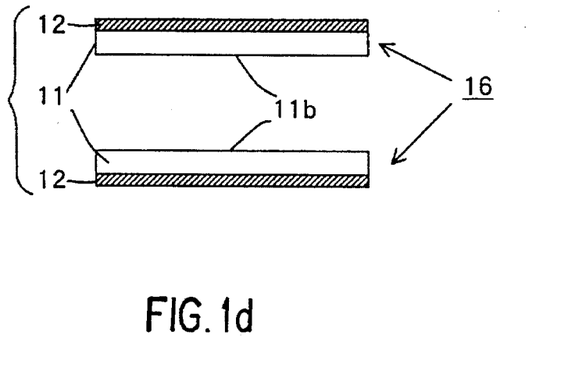

The cutting process described above gives, as shown in FIG. 1(b), two wafers 15 each of which is a wafer formed the silicon growth layer 12 on one side. The wafers 15 are possible to be used as substrates for manufacturing silicon semiconductor elements. But since the cut-surfaces 11a are not flat, they are treated by means of lapping, etching, polishing, etc. to obtain two substrates 16 with a flat surface 11b and a finely adjusted total thickness.

Specific examples are given below and described in detail by comparing with comparative examples. Since the double-side vapor phase growth process and the dividing-in-half process are the same as described above, they will not be described in detail. Example 1.

This is a method of manufacturing silicon epitaxial wafers to be used for manufacturing an IGBT.

Figure 3A:
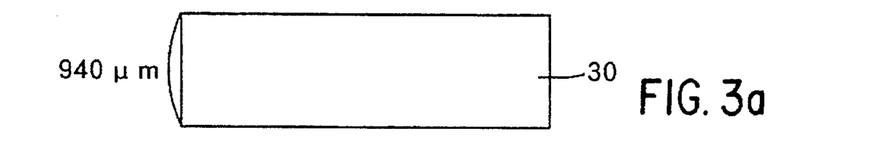
FIGS. 3a to 3d are process drawings which shows the manufacturing method of Example 1 of this invention.
Figure 3B:
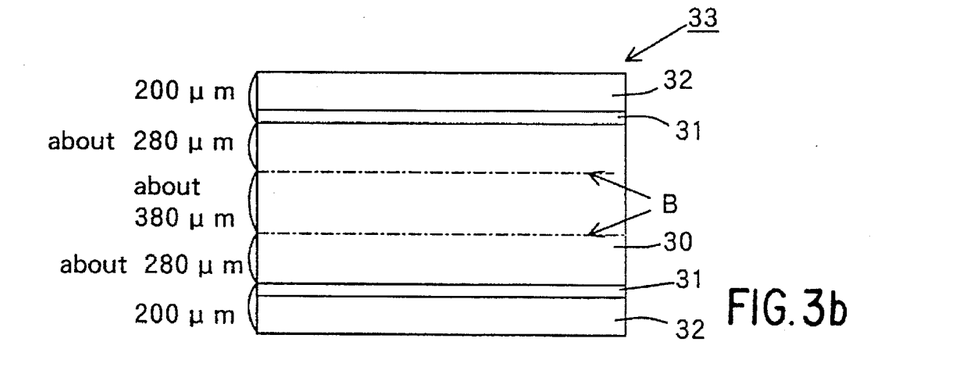
Figure 3C:
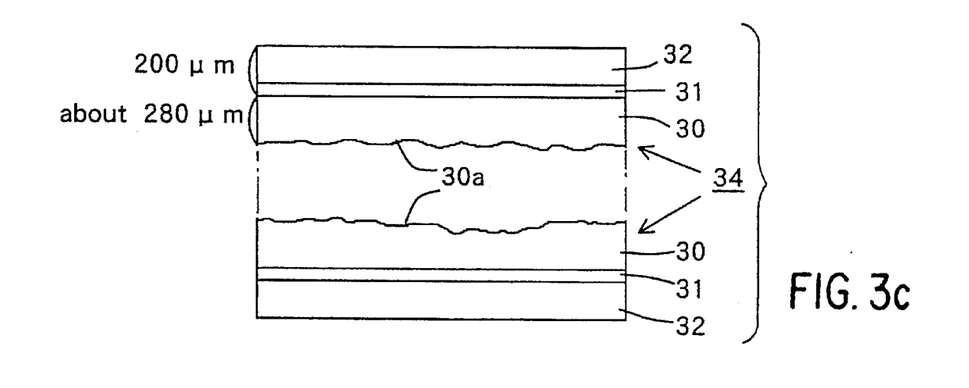
Figure 3D:
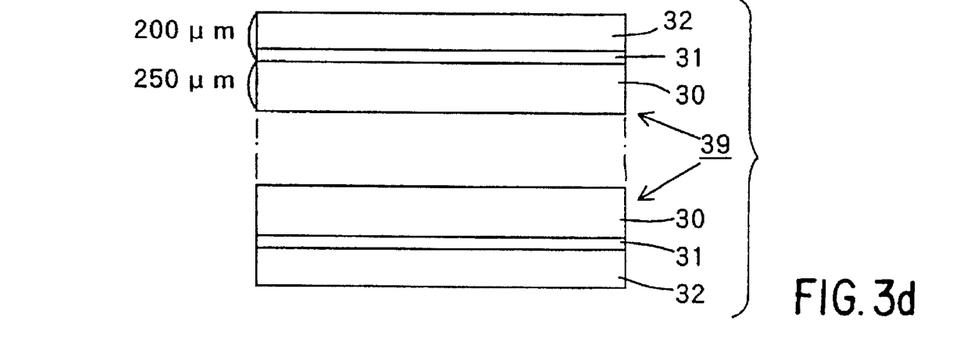

An example of the structure of the silicon epitaxial wafer used for manufacturing IGBT is shown in FIG. 3(d). This wafer is manufactured by the process shown in FIG. 3.

First, by means of the double-side vapor phase growth method, the silicon epitaxial growth layers 31 and 32 are formed one after another on both sides of a 940 micrometer-thick p+ silicon single crystal wafer 30 with mirror-polished surfaces on both sides (FIG. 3(a), with a boron (B) impurity concentration of approximately $4 \times 10^{18}$ atoms/$cm^3$), which serves as a silicon substrate wafer.

Specifically, $H_2$ as the carrier gas, trichlorosilane ($SiHCl_3$) as the silicon source gas and $PH_3$ as the doping gas are introduced and a 20 micrometer-thick n+ silicon epitaxial growth layer 31 (with a phosphorus (P) impurity concentration of approximately $8 \times 10^{16}$ atoms/$cm^3$) is formed at a temperature of 1130° C. and a growth rate of 1.5 micrometers/minute on both sides of the p+ silicon single crystal wafer 30. The supply of the doping gas ($PH_3$) is then reduced to form a 180 micrometers-thick n− silicon epitaxial growth layer 32 (with a phosphorus (P) impurity concentration of approximately $5 \times 10^{13}$ atoms/$cm^3$) on each of the n+ silicon epitaxial growth layers 31. Now, as shown in FIG. 3(b), a double-side epitaxial wafer 33, which is formed the n+ silicon epitaxial growth layers 31 and n− silicon epitaxial growth layers 32 one after another on both sides of the p+ silicon wafer 30, is obtained.

The double-side epitaxial wafer 33 thus obtained is then cut, with a diamond cutter, parallel to the main surface and approximately at the middle of the thickness of the p+ silicon single crystal wafer 30 portion (cutting-position B—B, the cutting loss is approximately 380 micrometers) to obtain two epitaxial wafers 34 which the silicon epitaxial growth layers 31 and 32 are formed on one side. The combined thickness of the silicon epitaxial growth layers 31 and 32 is 200 micrometers, the thickness of the silicon single crystal wafer 30 is approximately 280 micrometers, and a sum of the thickness is approximately 480 micrometers (FIG. 3(c)).

The cut surface 30a of the p+ silicon single crystal wafer 30 is then lapped and/or etched to make the cut surface 30a flat and also to reduce the total thickness from approximately 480 micrometers down to 450 micrometers. Now, two silicon epitaxial wafers 39 for manufacturing IGBT with a total thickness of 450 micrometers is obtained. Those structures are as follows: n− silicon epitaxial growth layer 32 (180 micrometers thick)/n+ silicon epitaxial growth layer 31 (20 micrometers thick)/p+ silicon single crystal wafer 30 (250 micrometers thick) (FIG. 3(d)).

COMPARATIVE EXAMPLE 1

Figure 4A:
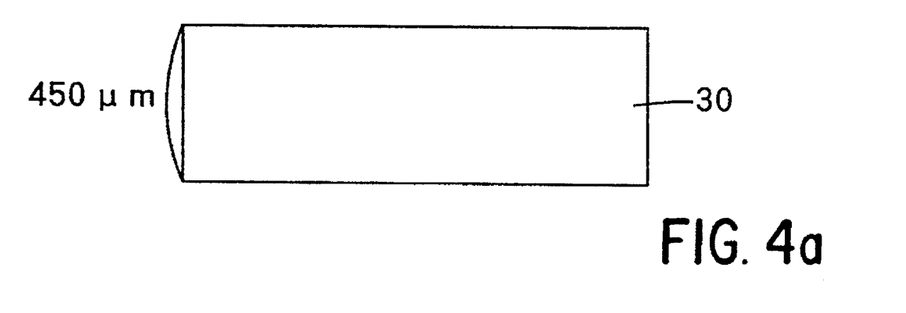
FIGS. 4a to 4a are process drawings which shows the manufacturing method of Comparative Example 1.
Figure 4B:
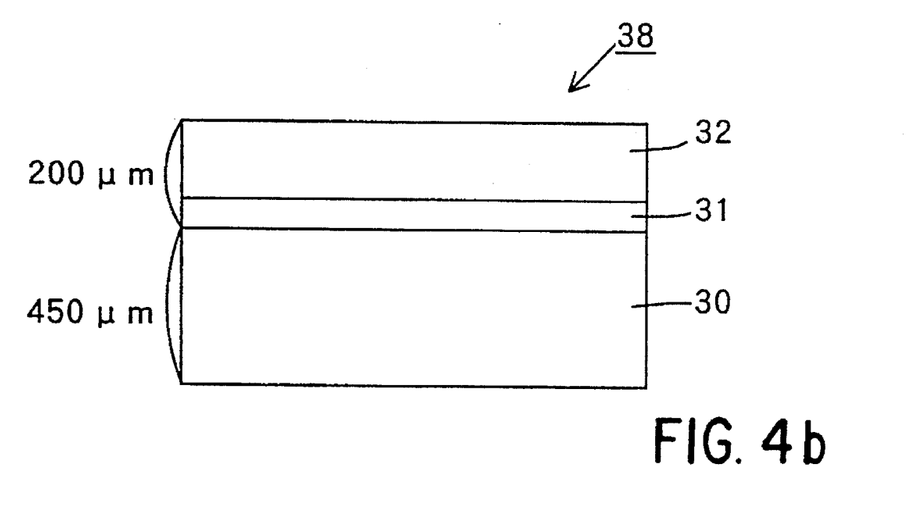

An epitaxial wafer for manufacturing IGBT which has the same structure as Example 1 is manufactured by using a conventional process shown in FIG. 4. That is, using the single-side vapor phase growth process, a 20 micrometer-thick n+ silicon epitaxial growth layer 31 (with a phosphorus (P) impurity concentration of approximately $8 \times 10^{16}$ atoms/cm$^3$) and a 180 micrometer-thick n− silicon epitaxial growth layer 32 (with a phosphorus (P) impurity concentration of approximately $5 \times 10^{13}$ atoms/cm$^3$) are formed one after another on a 450 micrometer-thick p+ silicon single crystal wafer 30 with a mirror-polished surface on one side (FIG. 4(a), with a boron (B) impurity concentration of approximately $4 \times 10^{18}$ atoms/cm$^3$) to obtain a silicon epitaxial wafer 38 with an n−/n+/p+ structure and a total thickness of approximately 650 micrometers. (FIG. 4(b)).

Figure 4C:
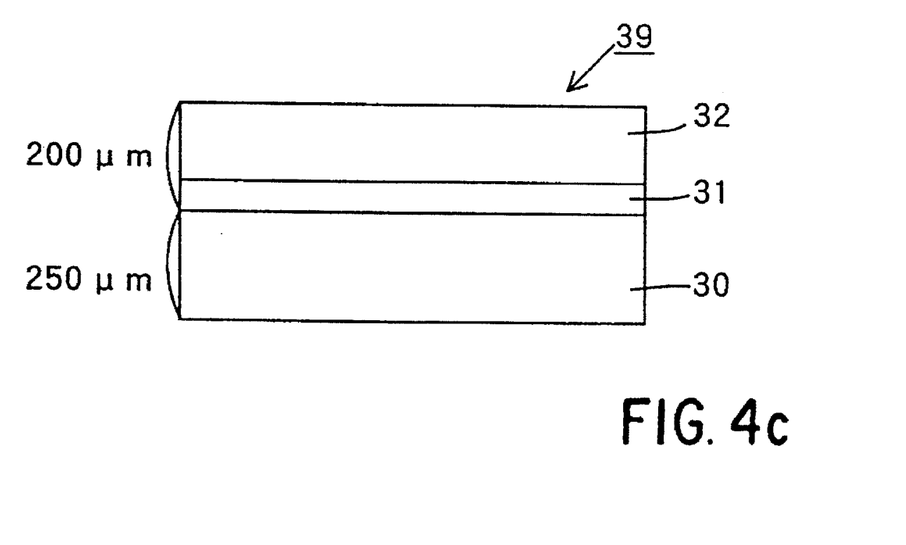

Approximately 200 micrometers of the p+ silicon single crystal wafer 30 side of the silicon epitaxial wafer 38 is then removed by means of lapping and/or etching to obtain a silicon epitaxial wafer 39 (Figure (c)) for manufacturing IGBT which has an n−/n+/p+ structure with a total thickness of 450 micrometers.

COMPARISON BETWEEN EXAMPLE 1 AND COMPARATIVE EXAMPLE 1

According to the method of Comparative Example 1, when the required thickness of the silicon single crystal wafer (silicon base substrate wafer) is, for example, 450 micrometers in order to ensure the strength of the base substrate wafer 30, the required thickness of the silicon single crystal [WAFER MATERIAL] is 950 micrometers per one epitaxial wafer for manufacturing IGBT, including the thickness of 500 micrometers for the wafer processing loss per one silicon single crystal wafer.

On the other hand, according to the method of Example 1, the thickness of the silicon single crystal [WAFER MATERIAL] required to obtain one double-side epitaxial wafer 33 is a sum of the thickness for the wafer processing loss for manufacturing the silicon single crystal wafer 30 (520 micrometers: this is slightly thicker because the double-side mirror-polishing as opposed to the conventional single-side mirror-polishing is performed), the thickness for the dividing loss (440 micrometers) and the thickness of two of the silicon base substrate wafers in the final epitaxial wafers used for manufacturing IGBT (250 micrometers each). In this case, the required thickness of the silicon single crystal [WAFER MATERIAL] is 1460 micrometers. Therefore, since one double-side epitaxial wafer 33 gives two epitaxial wafers 39 for manufacturing IGBT, the thickness of the silicon single crystal [WAFER MATERIAL] required to obtain one epitaxial wafer 39 for manufacturing IGBT is 730 micrometers. This is substantially thinner than 950 micrometers, the required thickness in Comparative Example 1.

In Example 1, since the thickness of the silicon base substrate wafer (here it is a silicon single crystal wafer) is 940 micrometers, that is thick enough to ensure the base substrate strength and to prevent deterioration of the crystalline quality due to thermal stress.

In Example 1, when a vapor phase growth apparatus of the same size as that of Comparative Example 1 is used to manufacture the epitaxial wafer, the number of silicon base substrate wafers loaded is the same but productivity is approximately twice as high as Comparative Example 1 because two epitaxial wafers for manufacturing IGBT are obtained from one silicon base substrate wafer.

EXAMPLE 2

This is a method of manufacturing a substrate with dielectric isolation.

Figure 5A:
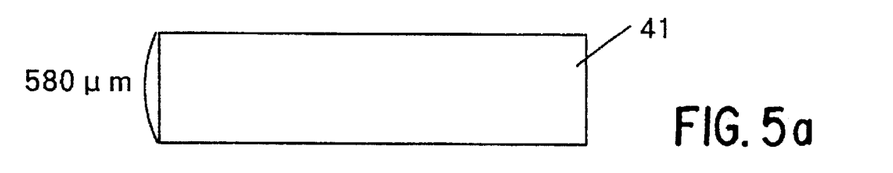
FIGS. 5a to 5e are drawings which shows the manufacturing method of Example 2 of this invention.
Figure 5B:
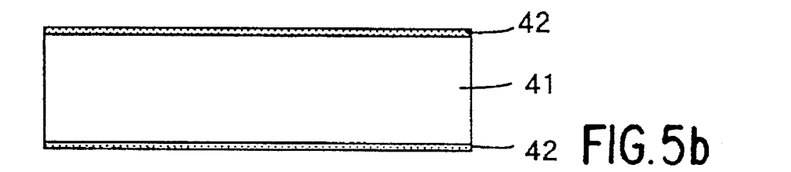
Figure 5C:
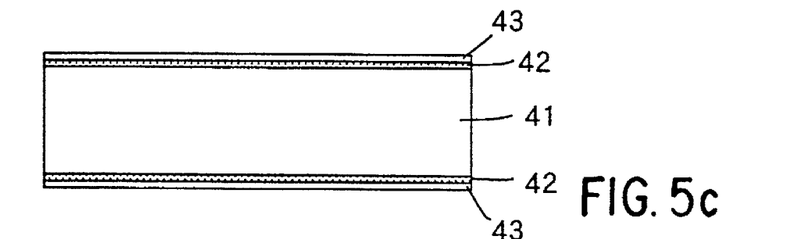
Figure 5D:
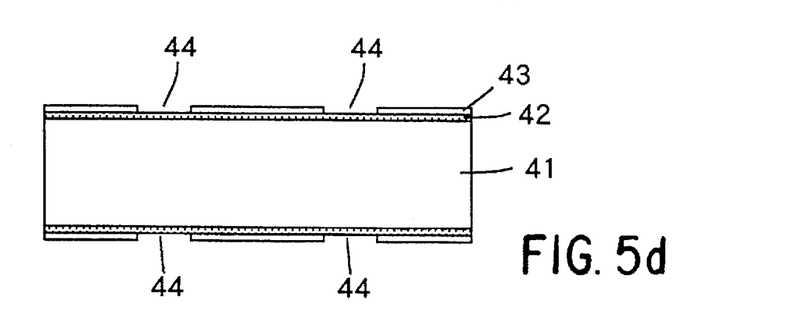
Figure 5E:
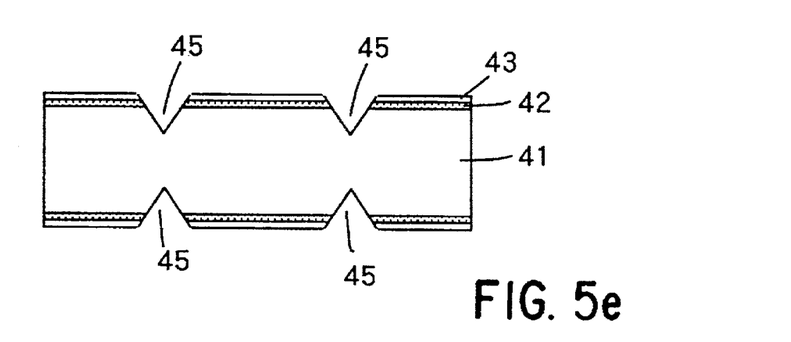
Figure 6A:
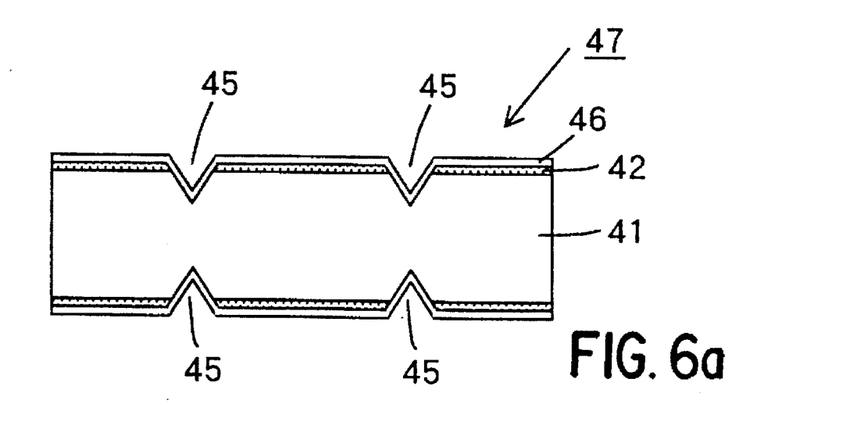
FIGS. 6a and 6b are process drawings which shows the manufacturing method of Example 2 of this invention.
Figure 6B:
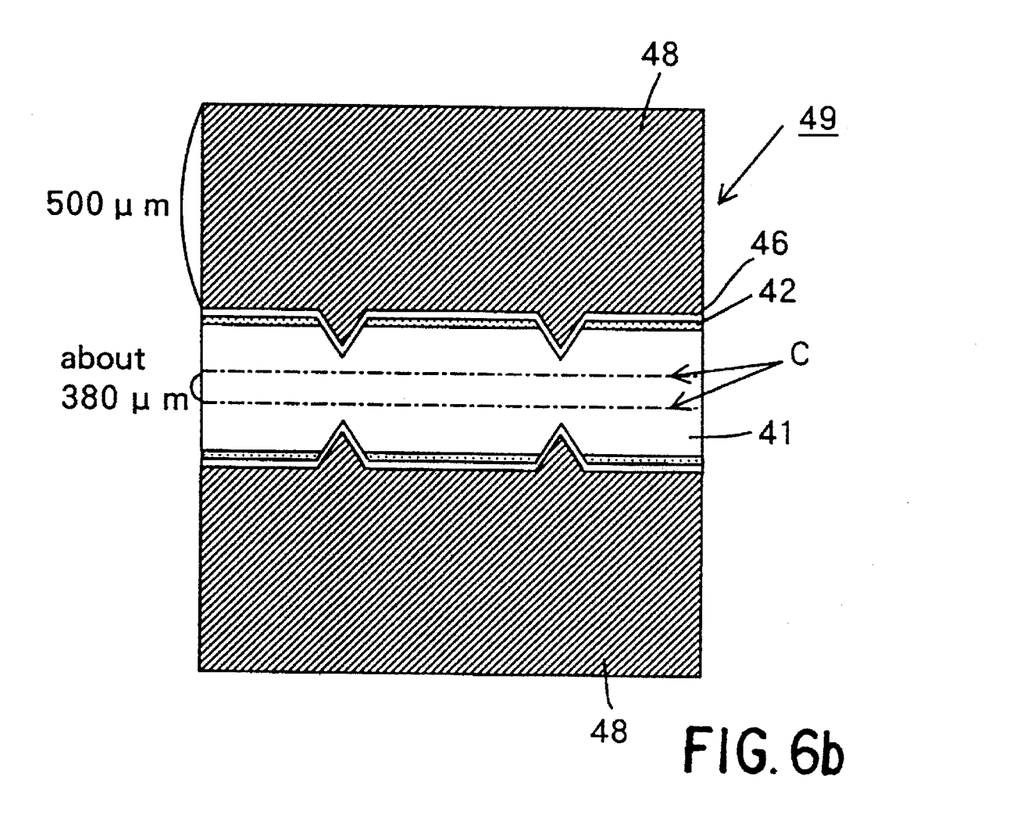
Figure 7A:
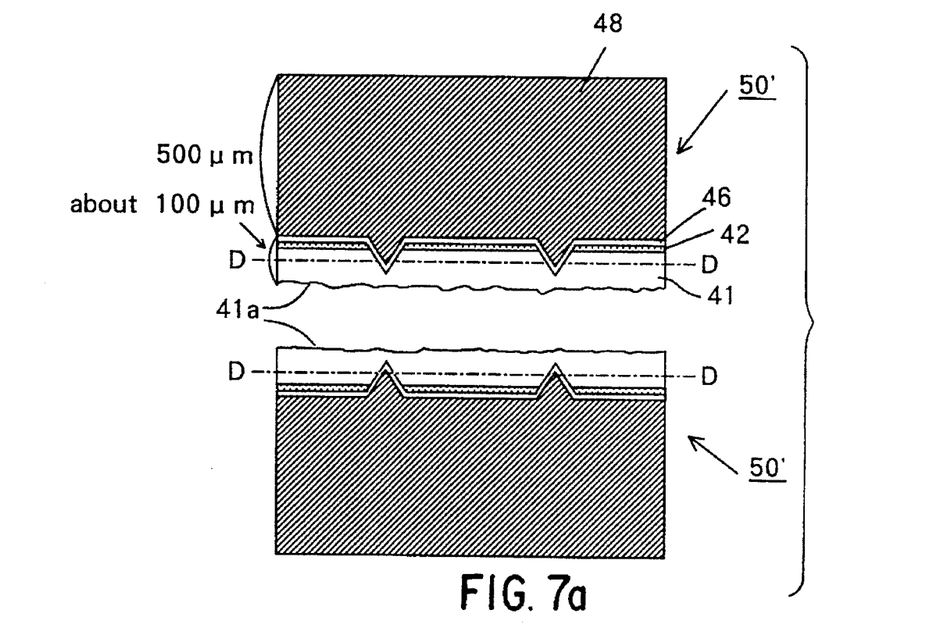
FIGS. 7a and 7b are process drawings which shows the manufacturing method of Example 2 of this invention.
Figure 7B:
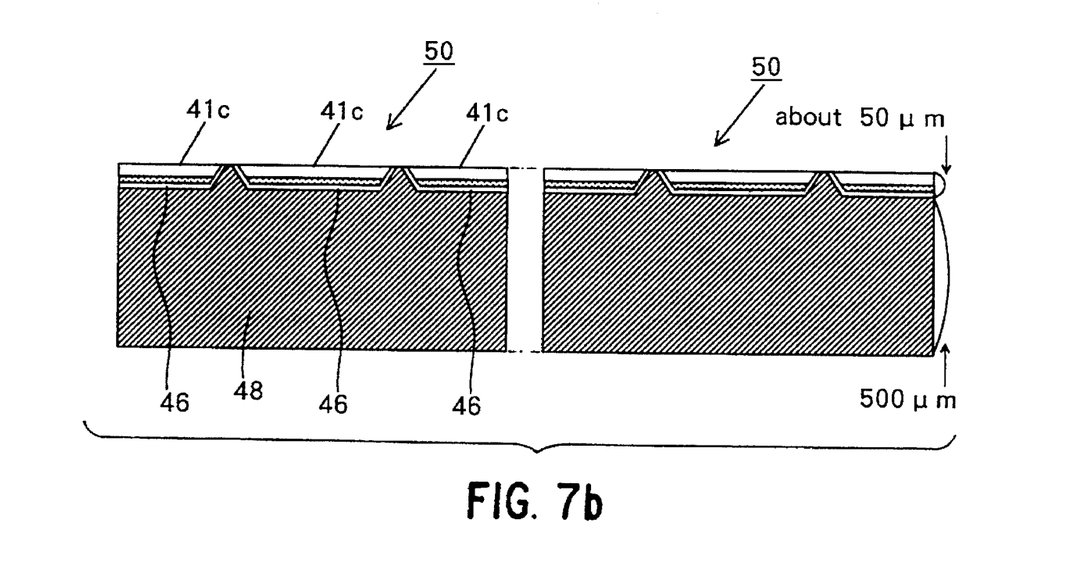
Figure 8A:
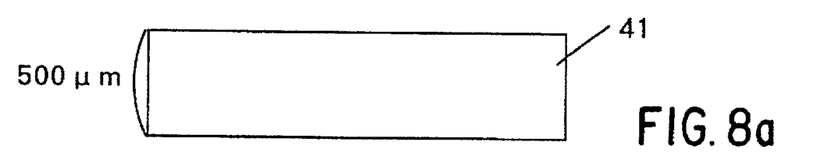
FIGS. 8a to 8e are process drawings which shows the manufacturing method of Comparative Example 2.
Figure 8B:
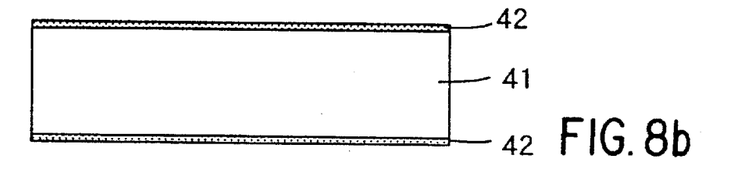
Figure 8C:
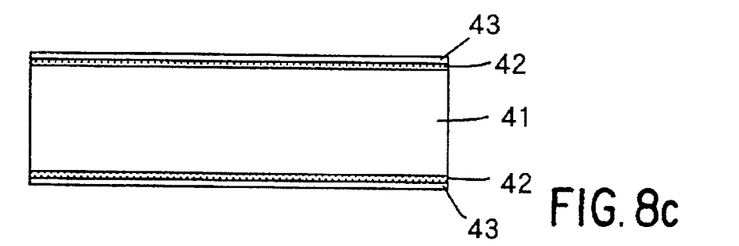
Figure 8D:
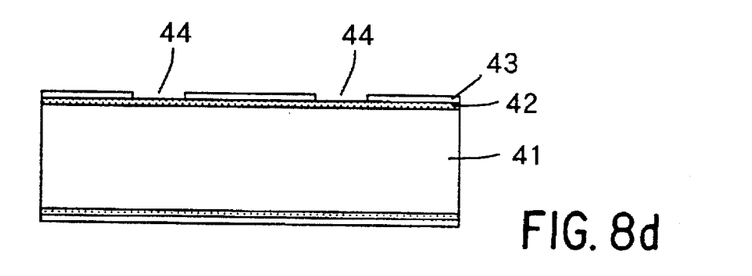
Figure 8E:
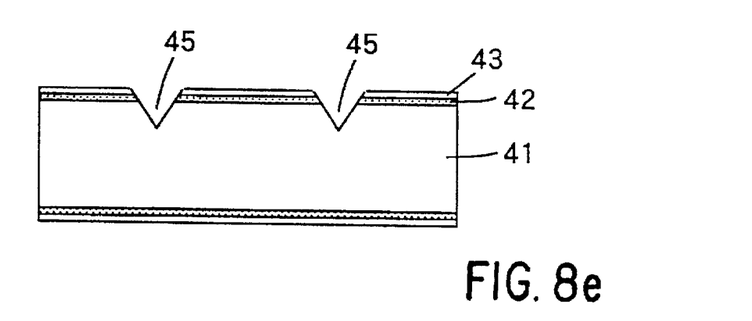

FIG. 7(i) shows an example of the structure of a typical substrate with dielectric isolation, which is manufactured by using the process shown in FIGS. 5 through 7. A method of manufacturing the substrate with dielectric isolation of this example is described below.

A dopant(s) such as Sb is doped by means of buried diffusion in both sides of a 580 micrometer-thick n-type silicon single crystal wafer 41 obtained by the double-side mirror-polishing (FIG. 5(a), with a phosphorus (P) impurity concentration of approximately $3 \times 10^{14}$ atoms/cm$^3$ and with a plane orientation of (100)) to form the n+ buried diffusion layers 42 (with diffusion depth of approximately 5 micrometers) (FIG. 5(b)).

An oxide film 43 (SiO$_2$, with a thickness of approximately 1 micrometer) is then formed on both main surfaces of the silicon single crystal wafer 41 (FIG. 5(c)) by means of, for example, the thermal oxidation method.

According to the desired isolation pattern, the oxide films 43 on both main surfaces of the silicon single crystal wafer 41 are treated to form windows 44 by means of the double-side photolithgraphic method (FIG. 5(d)).

Both surfaces of the silicon single crystal wafer 41 are then simultaneously etched selectively through the windows 44 to form isolation grooves 45 of V-shape cross section with depth of approximately 50 micrometers (FIG. 5(e)).

Then, by means of the thermal oxidation method, an isolation oxide film 46 with a thickness of approximately 2 micrometers is again formed on the entire surface area of both sides to obtain a silicon single crystal wafer which the isolation grooves 45 and the isolation oxide films 46 are formed on both sides, i.e. the silicon base substrate wafer 47 (FIG. 6(a)).

By means of the double-side vapor phase growth method, approximately 500 micrometer-thick silicon polycrystal layers 48 are then grown on the isolation oxide films 46 of both surfaces of the silicon base substrate wafer 47. Here, the silicon polycrystal layers 48 are formed by using Ha as the carrier gas and trichlorosilane (SiHCl$_3$) as the silicon source gas at a growth temperature of 1200° C. and a growth rate of 2 micrometers/minute. A wafer 49 comprising the silicon base substrate wafer 47 on both sides of which the silicon polycrystal layers 48 are formed is thus obtained (FIG. 6(b)).

The wafer 49 is then cut, with a diamond cutter parallel to the main surface approximately at the middle of the thickness of the silicon single crystal wafer 41 portion (cutting position C—C, a cutting loss is approximately 380 micrometers) to obtain two wafers 50', each with a total thickness of approximately 600 micrometers, which the one side of a silicon polycrystal layer 48 is formed on one side. (FIG. 7(a)).

The mirror-polishing process is then conducted from the cut-surface 41a of the wafer 50' until approximately 50 micrometers have been removed and the plane indicated with the alternate long and short dashed line D—D in FIG. 7(a) is reached, i.e. until at least the isolation oxide film at the bottom portion of the isolation grooves 45 is partially exposed or removed, to form the single crystal island areas 41c (approximately 50 micrometers thick) which are isolated like islands. Two substrates with dielectric isolation 50 are thus obtained (FIG. 7(b)).

COMPARATIVE EXAMPLE 2

Figures 9A, 9B:
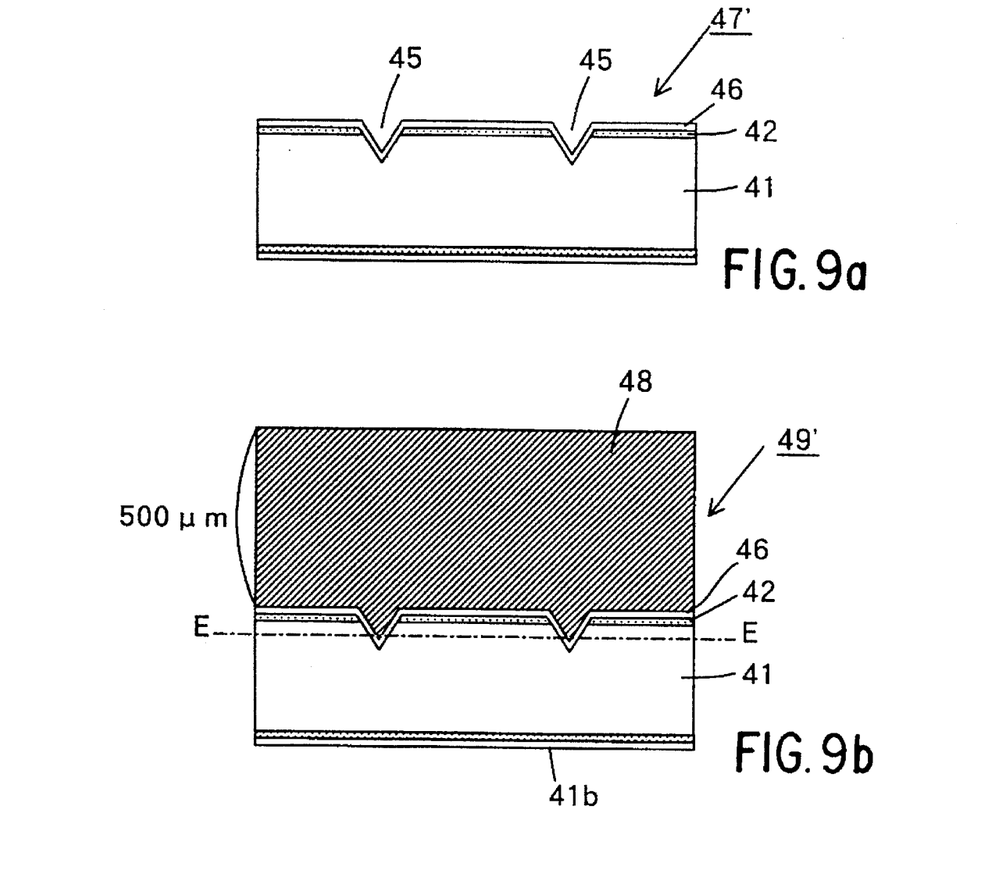
FIGS. 9a to 9c are process drawings which shows the manufacturing method of Comparative Example 2.
Figure 9C:
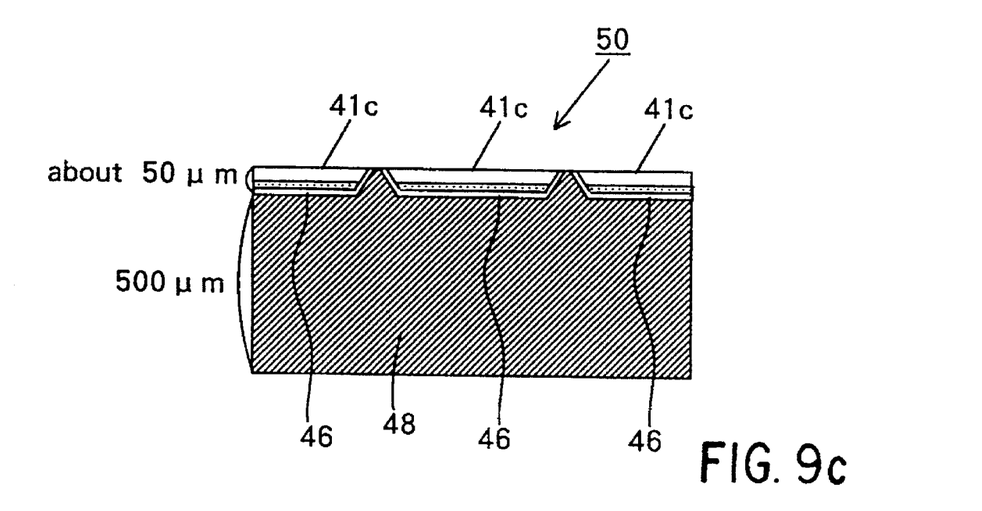

A substrate with dielectric isolation which has the same structure as that in Example 2 is manufactured by means of a conventional method. The manufacturing process is shown in FIGS. 8 and 9. In Comparative Example 2, a 500 micrometer-thick n-type silicon single crystal wafer 41 with a plane orientation of (100) and with single-side mirror-polished surface is used. The process shown in FIG. 8(b) through FIG. 9(a) is basically the same as the process shown in FIG. 5(b) through FIG. 6(a) in Example 2, except for the fact that the windows and the isolation grooves are formed only on one side of the silicon single crystal wafer 41.

After obtaining the silicon base substrate wafer 47' on one side of which the isolation grooves 45 are formed, as shown in FIG. 9(a), approximately 500 micrometers of the silicon polycrystal layer 48 is grown, by means of the single-side vapor phase growth method, on the isolation oxide film 46, with the same conditions as Example 2. The wafer 49', which the silicon polycrystal layer 48 is formed on one side of the silicon base substrate wafer 47', is thus obtained (FIG. 9(b)).

The mirror-polishing process is then conducted from the bottom surface 41b of the wafer 49' until approximately 450 micrometers have been removed and the plane indicated with the alternate long and short dashed line E—E in FIG. 9(b) is reached, i.e. until at least the isolation oxide film 46 at the bottom portion of the isolation grooves 45 is partially exposed or removed, to form the single crystal island areas 41c (approximately 50 micrometers thick) which are isolated like islands. One substrate with dielectric isolation 50 is thus obtained (FIG. 9(c)).

COMPARISON BETWEEN EXAMPLE 2 AND COMPARATIVE EXAMPLE 2

Comparison is made below between Example 2 and Comparative Example 2, in terms of the required thickness of the silicon single crystal [WAFER MATERIAL] to obtain one substrate with dielectric isolation, the crystalline quality and the manufacturing process.

1. The required thickness of the silicon single crystal [WAFER MATERIAL] (t)

(1) Example 2

$t$ = [(the thickness of the processing loss when manufacturing the silicon single crystal wafer 41 - double-side mirror-polished wafer) + (the thickness of the loss due to the dividing-in-half process) + (the thickness of the single crystal silicon island area of the substrate with dielectric isolation 50) × 2]/2

= (520 micrometers + 480 micrometers + 50 micrometers × 2)/2

= 550 micrometers (2) Comparative Example 2

$t$ = [the thickness of the processing loss when manufacturing the silicon single crystal wafer 41 - single-side mirror-polished wafer) + (the thickness of the single crystal silicon wafer 41)

= 500 micrometers + 500 micrometers

= 1000 micrometers (3) Conclusions

1) The thickness (amount) of the silicon single crystal [WAFER MATERIAL] required for obtaining one substrate with dielectric isolation in Example 2 is approximately half of that of Comparative Example 2.
2) The thickness of the silicon base substrate wafer in Example 2 is 580 micrometers, which is thick enough for a base substrate wafer.

2. Crystalline quality

In Comparative Example 2, since the thick polycrystal silicon layer is formed on one side of the silicon single crystal base substrate wafer, substantial warping occurs and the crystalline quality of the single crystal base substrate portion deteriorates. On the other hand, in Example 2 the polycrystal silicon layer forms on both sides of the single crystal base substrate wafer, and therefore even if the polycrystal silicon layers are thick, the warping stress components from the polycrystal silicon layers on two sides counterbalance each other, thus preventing deterioration of the crystalline quality of the single crystal base substrate portion.

3. Manufacturing process

In each of the processes described below, the productivity of Example 2 is approximately twice that of Comparative Example 2, allowing highly efficient production.
1) Formation of the windows 44
2) Formation of the isolation grooves 45
3) Growth of the polycrystal silicon layer 48

Also, in Comparative Example 2, the oxide film 46 and the n+ buried diffusion layer 42 of the bottom side (41b side) do not contribute to the manufacturing of the substrate with dielectric isolation, and those eventually are removed and thrown away. On the other hand, in Example 2, the oxide film 46 and n+ buried diffusion layer 42 of the bottom side are effectively utilized and therefore, in contrast to Comparative Example 2, there is no waste.

EXAMPLE 3

This is a method of manufacturing a silicon epitaxial wafer used for manufacturing bipolar IC.

Figure 10A:
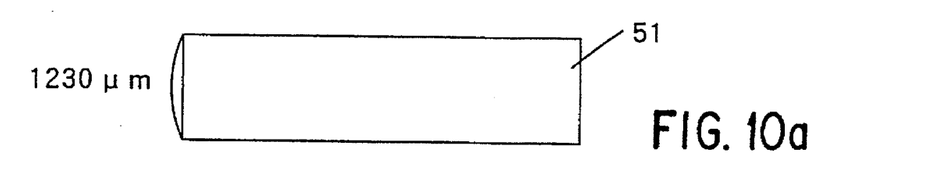
FIGS. 10a to 10e are process drawings which shows the manufacturing method of Example 3 of this invention.
Figure 10B:
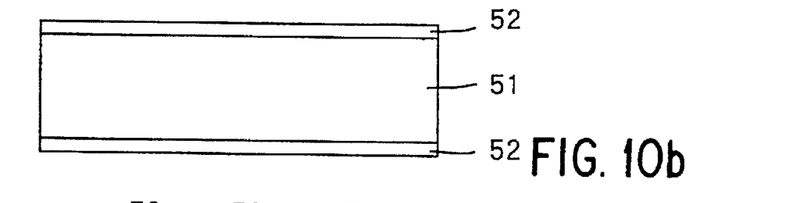
Figure 10C:
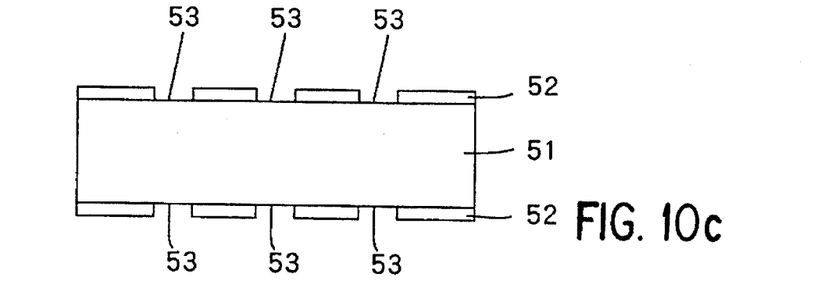
Figure 10D:
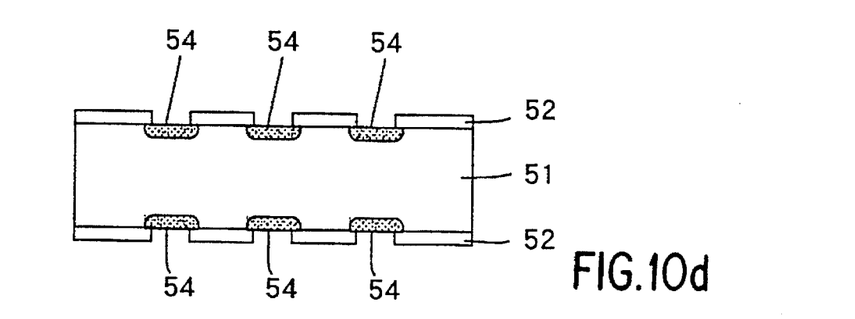
Figure 10E:
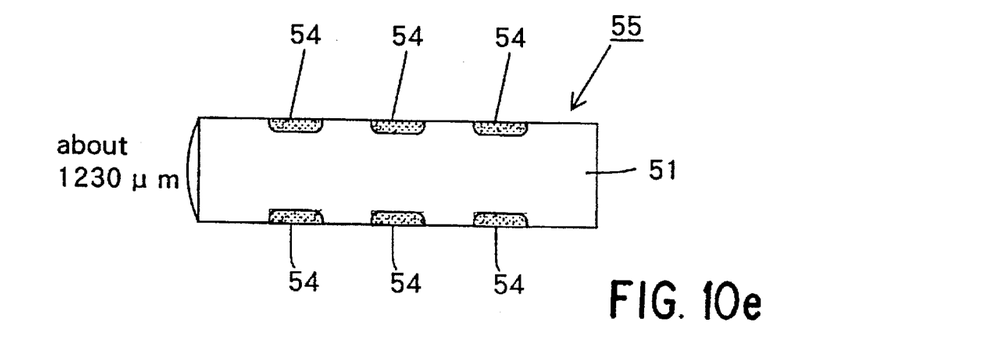
Figure 11A:
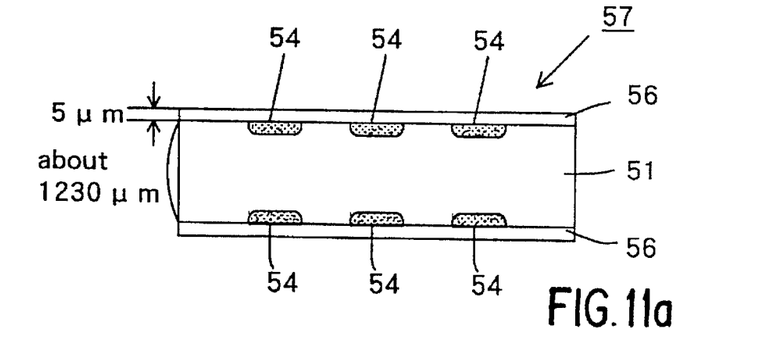
FIGS. 11a to 11c are process drawings which shows the manufacturing method of Example 3 of this invention.
Figure 11B:
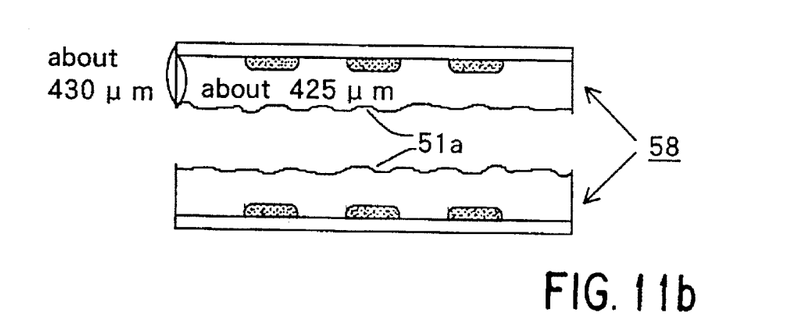
Figure 11C:
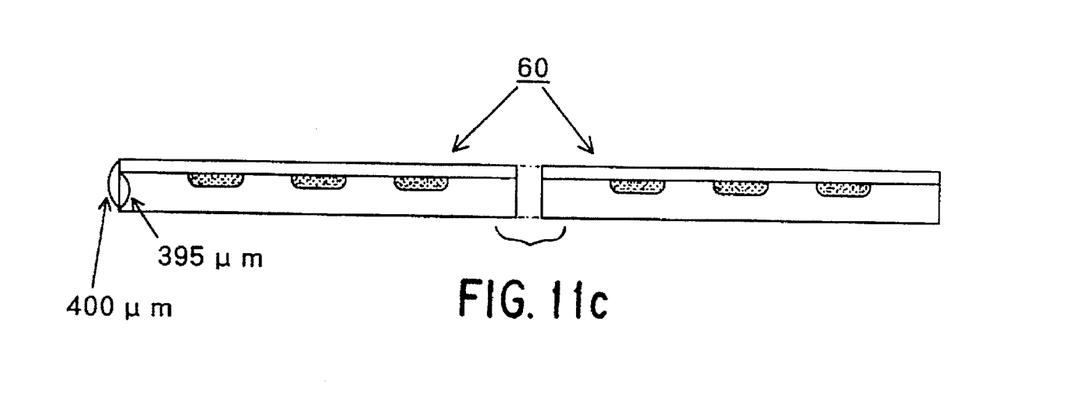

FIG. 11(c) shows an example of the structure of a silicon epitaxial wafer used for manufacturing bipolar IC, which is manufactured by using the process shown in FIGS. 10 and 11.

An oxide film 52 (approximately 1 micrometer thick) is formed on both sides of a 1230 micrometer-thick p-type silicon single crystal wafer 51 (FIG. 10(a), with a boron (B) impurity concentration of approximately $1\times10^{15}$ atoms/cm$^3$) by means of, for example, the thermal oxidation method (FIG. 10(b)).

According to a prescribed isolation pattern, the oxide films 52 of both main surfaces are then treated by means of the double-side photolithographic technique to form windows 53 (FIG. 10(c)).

By means of a conventional method, dopant(s) such as Sb and As is then diffused into both sides of the silicon single crystal wafer 51 through windows 53 to form the n+ buried diffusion layers 54 (with a diffusion depth of approximately 5 micrometers and with a surface impurity concentration of approximately $7\times10^{18}$ atoms/cm$^3$) (FIG. 10(d)).

The product is then immersed in a NH$_4$F-HF mixed solution to remove the oxide film 52. A silicon single crystal wafer in both sides of which the n+ buried diffusion layers 54 are formed according to the prescribed pattern, i.e. the silicon base substrate wafer 55, is thus obtained (FIG. 10(e)).

By means of the double-side vapor phase growth method and with the same growth conditions, except for the doping conditions, as the Example 1, 5 micrometer-thick silicon epitaxial growth layers 56 (with a phosphorus (P) impurity concentration of approximately $4\times10^{15}$ atoms/cm$^3$) are formed on both sides of the silicon base substrate wafer 55. Thus a wafer 57, which the silicon epitaxial growth layers 56 are formed on both sides of the silicon base substrate 55, is obtained (FIG. 11(a)).

The wafer 57 thus obtained is then cut with a diamond cutter, parallel to the main surface and approximately at the middle of the thickness of the silicon single crystal wafer 51. The cutting loss is approximately 380 micrometers. Here, as shown in FIG. 1(a)', it is also possible to paste a plurality of the wafers 57 using wax and such to make a lamination and then to cut it at the silicon single crystal wafer 51 portion of each wafer 57 with a diamond cutter. Two wafers 58 with a thickness of approximately 430 micrometers, which have the n+ buried diffusion layer 54 and the silicon epitaxial growth layer 56 on one side, are thus obtained, as shown in FIG. 11(b).

The cut-surface 51a of the wafer 58 is then mirror-polished to make the cut-surface 51a flat and also to reduce the total thickness from approximately 430 micrometers down to 400 micrometers. Thus obtained is a silicon epitaxial wafer 60 for manufacturing bipolar IC with a total thickness of 400 micrometers whose structure is; [the n-type silicon epitaxial growth layer (5 micrometer-thick)]/[the silicon single crystal wafer with n+ buried diffusion layer (395 micrometer-thick)] (FIG. 11(c)).

COMPARATIVE EXAMPLE 3

Figure 12A:
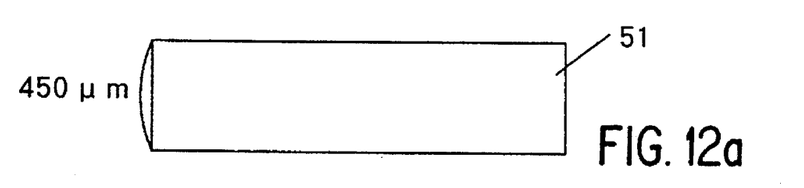
FIGS. 12a to 12e are process drawings which shows the manufacturing method of Comparative Example 3.
Figure 12B:
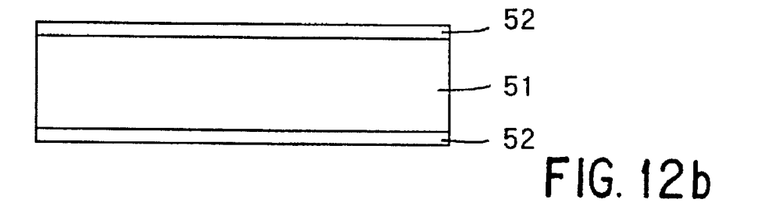
Figure 12C:
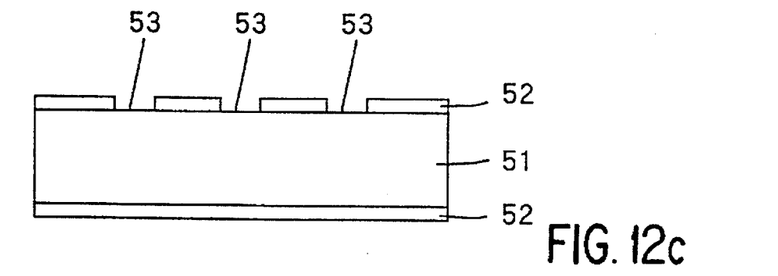
Figure 12D:
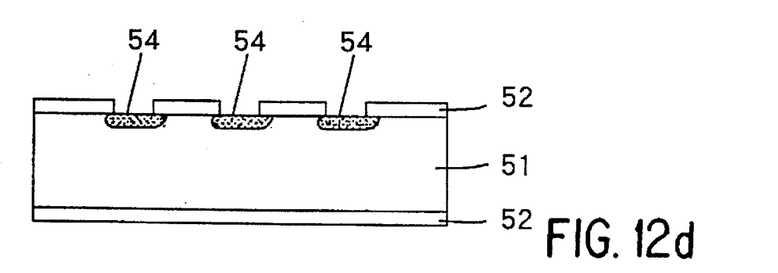
Figure 12E:
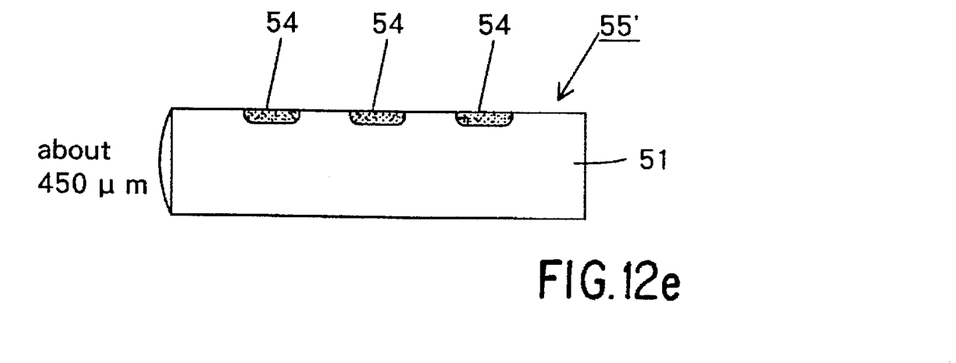
Figure 13A:
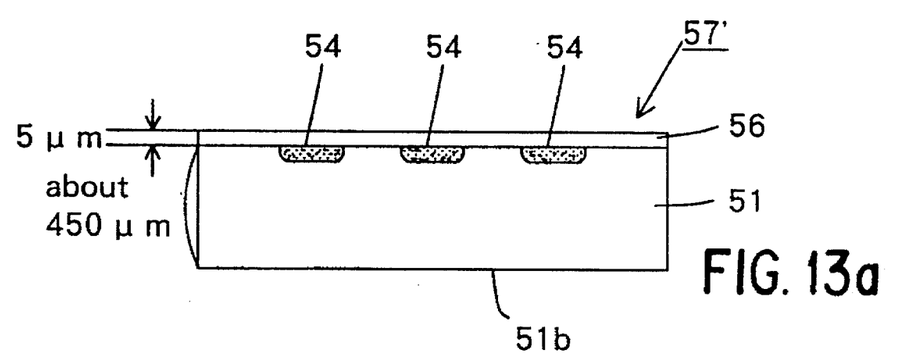
FIGS. 13a and 13b are process drawings which shows the manufacturing method of Comparative Example 3.
Figure 13B:
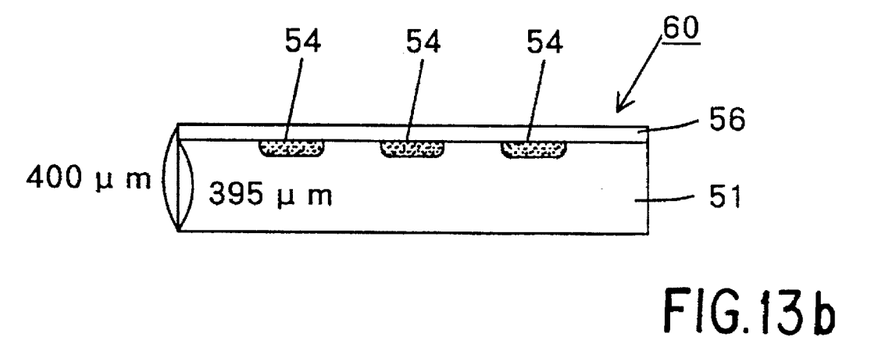

A silicon epitaxial wafer for manufacturing bipolar IC which has the same structure as that in Example 3 is manufactured by using a conventional process shown in FIGS. 12 and 13. In Comparative Example 3, a 450 micrometer-thick p-type silicon single crystal wafer 51, which a single-side mirror-polishing is performed, is used. The process shown in FIG. 12(b) through FIG. 12(e) is basically the same as the process shown in FIG. 10(b) through FIG. 10(e) in Example 3, except for the fact that the windows and the buried diffusion are formed only on one side of the silicon single crystal wafer 51.

By means of the single-side vapor phase growth method, a 5 micrometer-thick n-type silicon epitaxial growth layer 56 (with a phosphorus (P) impurity concentration of approximately $4\times10^{15}$ atoms/cm$^3$) is grown on the n+ buried diffusion layer of the silicon base substrate wafer 55' (FIG. 12(e)) which the n+ buried diffusion layer 54 is formed in one side of the silicon single crystal wafer 51, with the same growth conditions as those for Example 3. A wafer 57', which a silicon epitaxial growth layer 56 is formed on one side of the silicon base substrate wafer 55', is thus obtained (FIG. 13(a)).

The mirror-polishing process is then conducted from the bottom surface 51b of the wafer 57' to make the total thickness 400 micrometers. One silicon epitaxial wafer 60 with a total thickness of 400 micrometers for manufacturing bipolar IC is thus obtained (FIG. 13(b)).

COMPARISON BETWEEN EXAMPLE 2 AND COMPARATIVE EXAMPLE 2

Comparison is made below between Example 3 and Comparative Example 3, in terms of the required thickness of the silicon single crystal [WAFER MATERIAL] to obtain one silicon epitaxial wafer 60 for manufacturing bipolar IC (hereafter referred to as "BEpW") and the manufacturing process.

1. The required thickness of the silicon single crystal [WAFER MATERIAL] (t)

(1) Example 3

$t$ = [(the thickness of the processing loss when manufacturing the silicon single crystal wafer 51 - double-side mirror-polished wafer) + (the thickness of the loss due to the dividing-in-half process) + (the thickness of the single crystal silicon wafer of BEpW 60) $\times$ 2]/2

= (520 micrometers + 440 micrometers + 395 micrometers $\times$ 2)/2

= 875 micrometers (2) Comparative Example 3

$t$ = (the thickness of the processing loss when manufacturing the silicon single crystal wafer 51 - single-side mirror-polished wafer) + (the thickness of the single crystal silicon of 51)

= 500 micrometers + 450 micrometers

= 950 micrometers

2. Manufacturing process

In each of the processes described below, the productivity of Example 3 is approximately twice that of Comparative Example 3.

1) Formation of the windows 53
2) Formation of the n+ buried diffusion layer 54
3) Growth of the silicon epitaxial growth layer 56

As described thus far, this invention allows a drastic reduction in the amount of the silicon single crystal which is the material of silicon base substrate wafers and allows lower manufacturing costs of the substrates for manufacturing silicon semiconductor elements by using an efficient vapor phase growth process. Also, according to this invention, severe warping does not occur even when thick polycrystal silicon layers are formed, and therefore deterioration of the crystalline quality of the single crystal base substrate portion can be prevented.

I claim:

1. A method of manufacturing a substrate used for manufacturing silicon semiconductor elements comprising the steps of:

forming one or a plurality of silicon growth layers for forming silicon semiconductor elements on both sides of a silicon base substrate wafer by epitaxy; and dividing the product, with the dividing plane in said silicon base substrate wafer parallel to the sides, into two pieces to obtain two substrates used for manufacturing silicon semiconductor elements.

2. A method of manufacturing a substrate used for manufacturing silicon semiconductor elements as described in claim 1 wherein said step of dividing the product is a process in which said silicon base substrate wafer is cut along a plane parallel to the side(s), or a process which includes said cutting process followed by a process of treating the cut-surface to make the cut-surface flat and/or to adjust the total thickness.

3. A method of manufacturing a substrate used for manufacturing silicon semiconductor elements as described in claim 2 wherein said process which cuts the silicon base substrate wafer portion is a process in which the wafers made by forming a silicon growth layer(s) on both sides of said silicon base substrate wafers are cut one by one, or cut after a plurality of them are laminated.

4. A method of manufacturing a substrate used for manufacturing silicon semiconductor elements as described in claim 1 wherein said silicon base substrate wafer is a material selected among a silicon single crystal wafer, and a wafer in which an impurity-doped layer(s) is formed in a silicon single crystal wafer.

5. A method of manufacturing a substrate used for manufacturing silicon semiconductor elements comprising the steps of:

forming a diffusion layer doped with a dopant on both polished surfaces of a silicon single crystal substrate;

forming a thermal silicon oxide film on said diffusion layer;

opening a window having a desired isolation pattern on said thermal silicon oxide layer by the double-side photolithographic method;

etching said diffusion layer and said single crystal substrate through said window to form a groove of V-shape cross section;

forming a silicon oxide film for isolation on said both surfaces including said groove;

forming a silicon policrystal layer on said silicon oxide film;

dividing said processed substrate at said silicon single crystal substrate parallel to said surface to obtain two processed substrates; and removing said silicon single crystal substrate layer of said divided substrate on the flat until at least said silicon oxide film at a bottom portion of said groove is partially exposed or removed.

* * * * *